United States Patent
Lee et al.

(10) Patent No.: US 10,177,038 B1
(45) Date of Patent: Jan. 8, 2019

(54) PREVENTION OF CONTACT BOTTOM VOID IN SEMICONDUCTOR FABRICATION

(71) Applicant: Taiwan Semiconductor Manufacturing Co., Ltd., Hsinchu (TW)

(72) Inventors: Yun Lee, Taipei County (TW); Chung-Ting Ko, Kaohsiung (TW); Chen-Ming Lee, Taoyuan County (TW); Mei-Yun Wang, Hsin-Chu (TW); Fu-Kai Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/882,905

(22) Filed: Jan. 29, 2018

Related U.S. Application Data

(60) Provisional application No. 62/592,961, filed on Nov. 30, 2017.

(51) Int. Cl.
| | |
|---|---|
| *H01L 21/8239* | (2006.01) |
| *H01L 21/8234* | (2006.01) |
| *H01L 27/088* | (2006.01) |
| *H01L 29/417* | (2006.01) |
| *H01L 23/522* | (2006.01) |
| *H01L 23/528* | (2006.01) |

(52) U.S. Cl.
CPC ............... *H01L 21/823475* (2013.01); *H01L 21/823431* (2013.01); *H01L 27/0886* (2013.01); *H01L 23/5226* (2013.01); *H01L 23/5283* (2013.01); *H01L 29/41791* (2013.01)

(58) Field of Classification Search
CPC ......... H01L 21/823475; H01L 23/5226; H01L 23/5283; H01L 29/41791
USPC .......................................... 257/774; 438/666
See application file for complete search history.

(56) References Cited

U.S. PATENT DOCUMENTS

| | | | |
|---|---|---|---|
| 8,431,453 B2 * | 4/2013 | Huang | .................. H01L 27/088 257/369 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |

(Continued)

*Primary Examiner* — George Fourson, III

(74) *Attorney, Agent, or Firm* — Haynes and Boone, LLP

(57) ABSTRACT

A method for semiconductor fabrication includes providing a device structure having an isolation structure, a fin adjacent the isolation structure, gate structures over the fin and the isolation structure, one or more dielectric layers over the isolation structure and the fin and between the gate structures, a first contact hole over the fin, and a second contact hole over the isolation structure. The method further includes depositing a protection layer and treating it with a plasma so that the protection layer in the first contact hole and the protection layer in the second contact hole have different etch selectivity in an etching process; and etching the protection layer to etch through the protection layer on the bottom surface of the first contact hole without etching through the protection layer on the bottom surface of the second contact hole.

20 Claims, 7 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2011/0210447 A1* | 9/2011 | Seidel ............... H01L 21/76808 |
| | | 257/774 |
| 2013/0288471 A1* | 10/2013 | Chi ....................... H01L 29/665 |
| | | 438/586 |

* cited by examiner

US 10,177,038 B1

PREVENTION OF CONTACT BOTTOM VOID IN SEMICONDUCTOR FABRICATION

This is a non-provisional application of and claims priority to U.S. Provisional Patent Application Ser. No. 62/592,961, entitled "Prevention of Contact Bottom Void in Semiconductor Fabrication" and filed Nov. 30, 2017, the entire disclosure of which is hereby incorporated by reference.

BACKGROUND

FinFET devices have become a mainstream in semiconductor fabrication to achieve ever smaller device features and increased circuit performance. There are many challenges in fabricating these small FinFET devices in an integrated circuit (IC). For example, when forming contact features in FinFET devices, potential contact bottom voids have become a problem due to the topography on the wafer. Particularly, contact features situated between fins are relatively deeper and have higher aspect ratios than those situated on fins. Therefore, one issue associated with contact formation is that some contact holes are deep and narrow and it may be difficult for the contact features to completely fill these contact holes, thereby leaving voids under the contact features. These voids may be difficult to detect during the manufacturing stage, but they may cause problems such as circuit short or open over time. Accordingly, improvements in contact formation process are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2G, 2H, and 2I represent various embodiments of a portion of FIG. 2F.

DETAILED DESCRIPTION

Figure 1:
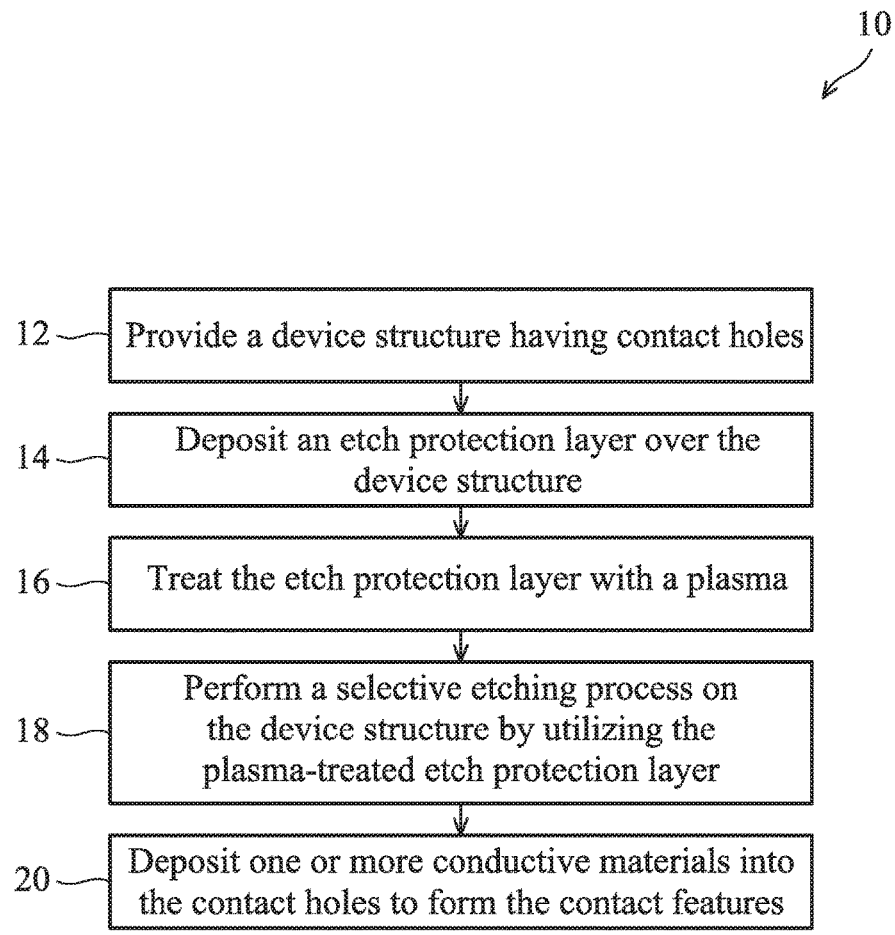
FIG. 1 is a flow chart of a method of forming a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to contact formation processes in semiconductor manufacturing, particularly FinFET device fabrication, to avoid the formation of contact bottom voids. According to some embodiments of the present disclosure, an etch protection layer is conformably deposited into the contact holes of a semiconductor device. The etch protection layer is then treated with plasma. In this process, the bottom surfaces of deeper contact holes (e.g., those located above shallow trench isolations) receive less or no plasma exposure and therefore become more resistant to a wet etching process than the bottom surfaces of shallower contact holes (e.g., those located above fins). As a result, the wet etching process can selectively remove the plasma-treated etch protection layer over the fins without exposing oxide(s) in the deeper contact holes, thereby preventing the formation of voids under contact features. This and other benefits of the present disclosure will become evident by referring to the accompanying figures and the associated descriptions below.

FIG. 1 shows a flow chart of a method 10 for forming a semiconductor device 100, according to various embodiments of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. In the following discussion, the method 10 is described with reference to FIGS. 2A-2F. FIGS. 2A-2F illustrate the semiconductor device 100 in intermediate stages of fabrication.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A-2F may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
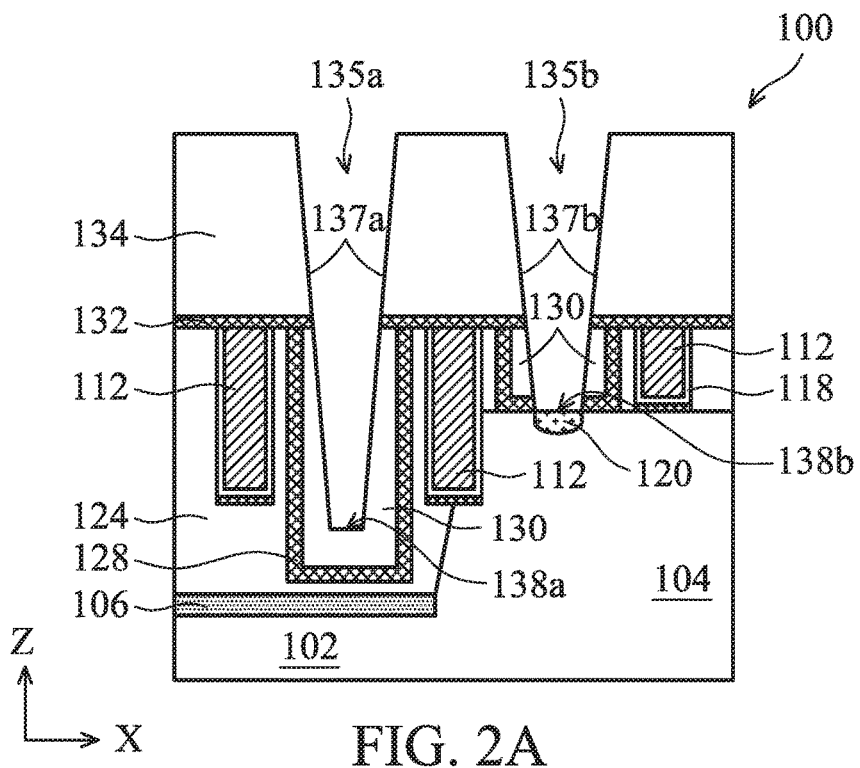
FIGS. 2A, 2C, 2D, 2E, 2F, 2G, 2H, and 2I are cross-sectional views of a portion of a semiconductor device at various intermediate stages of fabrication according to various embodiments of the present disclosure, where
Figure 2B:
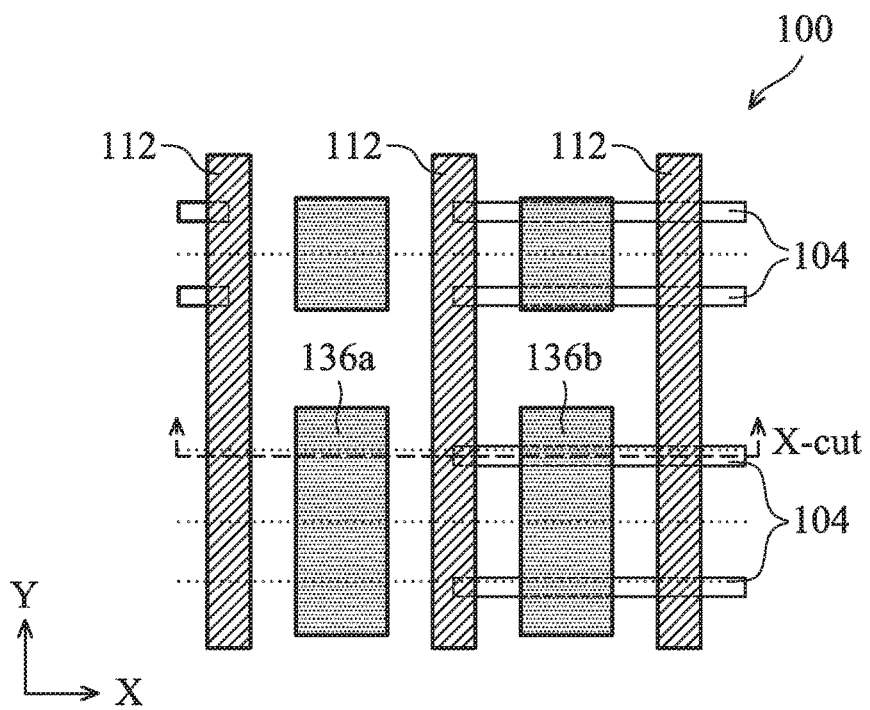
FIG. 2B is a schematic top view of a portion of the semiconductor device at an intermediate stage of fabrication according to various embodiments of the present disclosure.

At operation 12, the method 10 (FIG. 1) provides or is provided with a device structure (or device) 100 as shown in FIGS. 2A and 2B. Referring to FIG. 2A, which shows a cross-sectional view in the "X" direction (an X-cut), the device 100 has various structures or components including: a substrate 102; a fin 104 extending from the substrate 102; a source or drain (S/D) feature 120 embedded in the fin 104; an isolation structure 106 that isolates the fin 104 from other fins or active regions; a plurality of gate structures 112 over the fin 104 and the isolation structure 106; an inter-layer dielectric (ILD) layer 124 over the isolation structure 106 and the fin 104 as well as between the gate structures 112; a contact etch stop layer (CESL) 128 formed over the ILD layer 124 and various other structures of the device 100; another ILD layer 130 formed over the CESL 128; another CESL 132 formed on top of the ILD layer 124, the CESL 128, the ILD layer 130, and the gate structures 112; another ILD layer 134 over the CESL 132; and a plurality of contact holes (e.g., 135a and 135b) formed across multiple layers of the device 100. Referring to FIG. 2B, which shows an illustrative top view of certain structures in the device 100, it can be seen that the device 100 includes a plurality of fins 104. The fins 104 may run in parallel in one direction and may be broken to segments. The device 100 further includes metal contacts such as 136a and 136b, which are formed by filling contact holes 135a and 135b. The device 100 as shown in FIG. 2A may be fabricated using various processes and/or materials, as discussed below.

The substrate 102 is a silicon substrate in the present embodiment. In alternative embodiments, the substrate 102 includes other elementary semiconductors such as germanium; a compound semiconductor such as silicon carbide, gallium arsenide, indium arsenide, and indium phosphide; or an alloy semiconductor, such as silicon germanium carbide, gallium arsenic phosphide, and gallium indium phosphide. In embodiments, the substrate 102 may include silicon on insulator (SOI) substrate, be strained and/or stressed for performance enhancement, include epitaxial regions, include isolation regions, include doped regions, and/or include other suitable features and layers.

The fins 104 comprise one or more semiconductor materials such as silicon, germanium, silicon germanium, silicon carbide, gallium arsenide, indium arsenide, indium phosphide, silicon germanium carbide, gallium arsenic phosphide, and gallium indium phosphide. The fins 104 may be doped with proper dopants for forming FinFETs. For example, the fins 104 may be doped with one or more p-type dopants, such as boron or indium, or one or more n-type dopants, such as phosphorus or arsenic. The fins 104 may include doped regions such as lightly doped regions and heavily doped regions, and may include epitaxially grown materials.

In the embodiment shown in FIG. 2A, the S/D feature 120 is fully embedded in the fin 104 such as heavily doped S/D regions. In another embodiment, the S/D feature 120 may be partially embedded in the fin 104 and rise above the fin 104, such as epitaxially grown semiconductor material with proper dopant(s). The S/D feature 120 may be considered part of the fin 104 in some embodiments. The S/D feature 120 may further include silicidation or germanosilicidation. Although only one S/D feature 120 is shown in FIG. 2A, it should be appreciated that device 100 may have multiple S/D features 120. For example, two S/D features 120 can reside on both sides (one on each side) of the gate structure 112 on the fin 104.

The fins 104 may be may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 102 and patterned using a photolithography process. Spacers are formed alongside the patterned sacrificial layer using a self-aligned process. The sacrificial layer is then removed, and the remaining spacers, or mandrels, may then be used to pattern the fins 104 by etching the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

The isolation structure 106 may comprise silicon oxide, silicon nitride, silicon oxynitride, fluoride-doped silicate glass (FSG), a low-k dielectric material, and/or other suitable insulating material. The isolation structure 106 may be shallow trench isolation (STI) features in some embodiments. The isolation structure 106 may be formed by etching trenches in the substrate 102, e.g., as part of the fins 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

In the present embodiment, the fins 104 are taller than the isolation structure 106. In other words, the top surface of the fins 104 is higher in the "Z" direction than the top surface of the isolation structure 106. This may be formed, for example, by etching back the isolation structure 106 after the fins 104 are formed, or by epitaxially growing the fins 104 from trenches in the isolation structure 106.

The ILD layer 124 is situated over the isolation structure 106 and the fin 104 as well as between the gate structures 112. In an embodiment, the ILD layer 124 is deposited by a flowable chemical vapor deposition (FCVD) method. For example, a flowable material (such as a liquid compound) is deposited on the device 100 over various structures, and one or more annealing processes are performed to convert the flowable material to a solid material. In an alternative embodiment, the ILD layer 124 may be deposited by other deposition methods such as a plasma enhanced CVD (PECVD) method. The ILD layer 124 may further undergo other processes such as chemical mechanical planarization (CMP) and selective etching to facilitate the formation of structures on top of the ILD layer 124. For example, in some embodiments, the ILD layer 124 over the fins 104 may be removed and the ILD layer 124 over the isolation structure 106 may be recessed such that its top surface is at about the same level as the top surface of the fins 104. The ILD layer 124 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials.

The CESL 128 is formed over the ILD layer 124 (and over other structures such as the fins 104). The CESL 128 includes a dielectric material such as silicon nitride ($Si_3N_4$), silicon oxide ($SiO_2$), silicon oxynitride (SiON), and/or other materials. The CESL 128 may be formed by one or more methods including plasma enhanced CVD (PECVD), ALD, and/or other suitable deposition or oxidation processes.

In some embodiments, the ILD layer 130 is formed over the CESL 128. During its formation, the ILD layer 130 may fill in the trenches and cover the topography of the device 100. In an embodiment, the ILD layer 130 is deposited by a FCVD method including depositing a flowable material and annealing the flowable material. In an alternative embodiment, the ILD layer 130 may be deposited by other deposition methods such as a plasma enhanced CVD (PECVD) method. The ILD layer 130 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. Further, the ILD layers 124 and 130 may comprise the same or different dielectric materials.

As shown in FIG. 2A, the gate structures 112 are situated over the fin 104 and the isolation structure 106. The gate structures 112 may penetrate an upper portion of the ILD layer 124, or alternatively penetrate through the ILD layer 130, which may reside over the ILD layer 124. Each of the gate structures 112 may be a multi-layer structure. For example, each gate structure 112 may include a gate dielectric layer, a gate electrode layer situated over the gate dielectric layer, and a spacer layer as sidewalls of the respective gate structure 112. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer of each gate structure 112 may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbide nitride (TaCN), tantalum silicon nitride (TaSiN), or combinations thereof. The p-type or n-type work function metal layer may include a plurality of layers and may be deposited by CVD, PVD, and/or other suitable process. The gate electrode layer may further include a metal fill (or a bulk metal) layer that includes aluminum (Al), tungsten (W), cobalt (Co), copper (Cu), and/or other suitable materials, and may be formed by CVD, PVD, plating, and/or other suitable processes. The spacer layer of each gate structure 112 may be a single layer or multi-layer structure. For example, the spacer layer may include a dielectric material, such as silicon oxide, silicon nitride, silicon oxynitride, other dielectric material, or combination thereof.

The CESL 132 may be formed (e.g., via deposition and selective etching) on top of the ILD layer 124, the CESL 128, the ILD layer 130, and the gate structures 112. The CESL 132 may comprise silicon nitride ($Si_3N_4$), silicon oxide ($SiO_2$), silicon oxynitride (SiON), and/or other materials, and may be formed by one or more methods including plasma enhanced CVD (PECVD), ALD, and/or other suitable methods. In some embodiments, the ILD layer 134 is formed over the CESL 132. The ILD layer 134 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), a low-k dielectric material, and/or other suitable dielectric materials. The ILD layer 134 may be formed by FCVD, PECVD, or other suitable methods. Contact holes such as 135a and 135b may be formed (e.g., via etching) to penetrate the ILD layer 134, the CESL 132, the ILD layer 130, and the CESL 128. As shown in FIG. 2A, over the top of the isolation structure 106 and offset from the fin 104, the contact hole 135a exposes a top portion of the ILD layer 130. Over the top of the fin 104, the contact hole 135b exposes a part of the S/D feature 120. The contact hole 135a comprises sidewall surfaces 137a and a bottom surface 138a, and the contact hole 135b comprises sidewall surfaces 137b and a bottom surface 138b (the bottom surface 138b is effectively the same as the top surface of the S/D feature 120). The method 10 then forms contact features such as 136a and 136b in the positions of contact holes such as 135a and 135b, respectively. This involves a variety of processes, as discussed below.

Figure 2C:
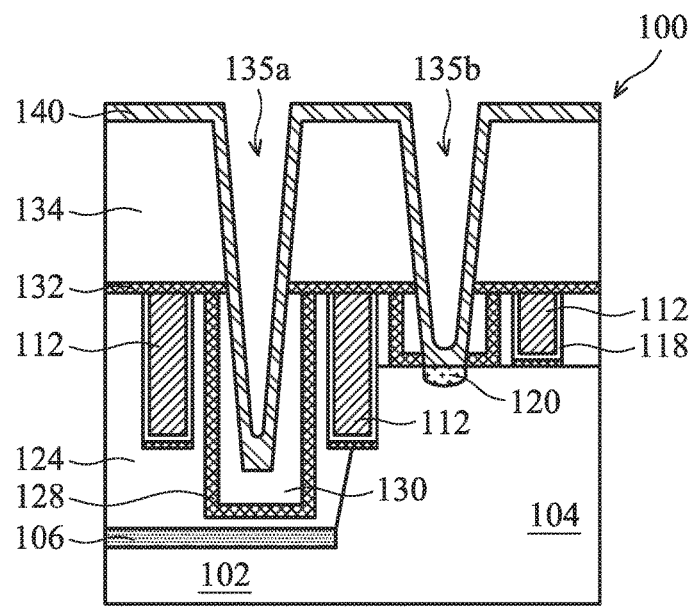

At operation 14, the method 10 (FIG. 1) deposits an etch protection layer 140 over the device 100 (FIG. 2C). The etch protection layer 140—sometimes referred to as another spacer layer—covers at least bottom surfaces and sidewall surfaces of the contact holes such as 135a and 135b, but may additionally cover other surfaces of the device 100. The etch protection layer 140 includes a dielectric material such as silicon nitride ($Si_3N_4$), silicon oxide ($SiO_2$), silicon oxynitride (SiON), and/or other suitable materials. Since the etch protection layer 140 is to be selectively etched later, the composition of the etch protection layer 140 may be tailored or optimized for such a selective etching process (described in details further below). The etch protection layer 140 may be formed by one or more methods including PECVD, ALD, and/or other suitable deposition or oxidation processes. In some embodiments, the etch protection layer 140 is a thin layer with a generally conformal thickness across the top of the device 100. The conformal quality of the etch protection layer 140 through the sidewalls 138a and 138b helps avoid a current leakage path from the contact features 136a and 136b to gate structures 112, or vice versa. In some embodiments, operation 14 may be repeatedly executed to reach a target thickness of the etch protection layer 140.

The etch protection layer 140 serves various purposes. To illustrate its purposes, it should first be noted that, the contact feature 136b is to be electrically connected to the S/D feature 120 located on the fin 104, and therefore should have a reliable electrical connection or coupling with the S/D feature 120. However, during etch formation of the contact hole 135b, a top surface of the S/D feature 120 may have been possibly oxidized due to its exposure to the etchant (and possibly air). Therefore, before forming the contact feature 136b, a pre-cleaning process may help remove any unwanted materials (e.g., oxides) from the top surface of the S/D feature 120. The pre-cleaning process may be performed via wet etching, which attacks not only the bottom surface 138b of the contact hole 135b but also its sidewall surfaces 137b. The sidewall surfaces 137b comprises different structures and/or layers such as the ILD layer 134, the CESL 132, the ILD layer 130, and the CESL 128, which may have different etch selectivity to the pre-cleaning etchant. Consequently, if the sidewall surfaces 138b are not covered during pre-cleaning by any etch protection layer such as 140, the sidewall surfaces 138b may be removed unevenly. Further, a horizontal dimension of the contact hole 135b (e.g., in the X-direction as shown in FIG. 2A) may be expanded, which increase a critical dimension (CD) of the contact feature 136b to be formed in the contact hole 135b. To address such issues, the etch protection layer 140 is deposited to create a homogeneous and uniform layer of material on the sidewall surfaces 137b, thereby preventing an uneven sidewall profile. Further, the etch protection layer 140 effectively prevents the horizontal dimension of the contact hole 135b from expanding, thereby maintaining the CD of the contact feature 136b to be formed in the contact hole 135b.

At operation 16, the method 10 (FIG. 1) treats the etch protection layer 140 with a plasma 142. In some embodiments, the plasma 142 is applied directionally and uniformly to the top surface of the device 100, but due to the different geometries (e.g., depths) of contact holes such as 135a and 135b, different portions of the etch protection layer 140 are exposed to different dosages of the plasma 142. For example, after sufficient plasma treatment at the bottom surface 138b of the contact hole 135b, the much deeper bottom surface 138a of the contact hole 135a may be exposed to a smaller dosage, if any, of the plasma 142. Such a plasma treatment helps improve etch selectivity of different areas of the etch protection layer 140. For example, operation 16 may be performed such that the protection layer 140 on the bottom surface 138a of the contact hole 135a and the protection layer 140 on the bottom surface 138b of the contact hole 135b have different etch rates in a later etching process (performed in operation 18). One physical mechanism underlying the etch selectivity change is that the plasma 142 breaks down chemical bonds of the etch protection layer 140. For example, the plasma may break down more Si—N bonds on the bottom surface 138b than on the bottom surface 138a because the bottom surface 138b is more heavily bombarded by the plasma 142. Therefore, the loose molecular bonding of the etch protection layer 140 (e.g., $Si_3N_4$) on the bottom surface 138b leads to a higher etch rate in the later dry or wet etching process (operation 18). For example, a wet etching solution (dHF/$NH_3$+$NF_3$) may be mainly an oxide etcher that reacts with loose or broken Si—N bonds to form $SiO_x$ or Si—O—N bonds.

Figure 2D:
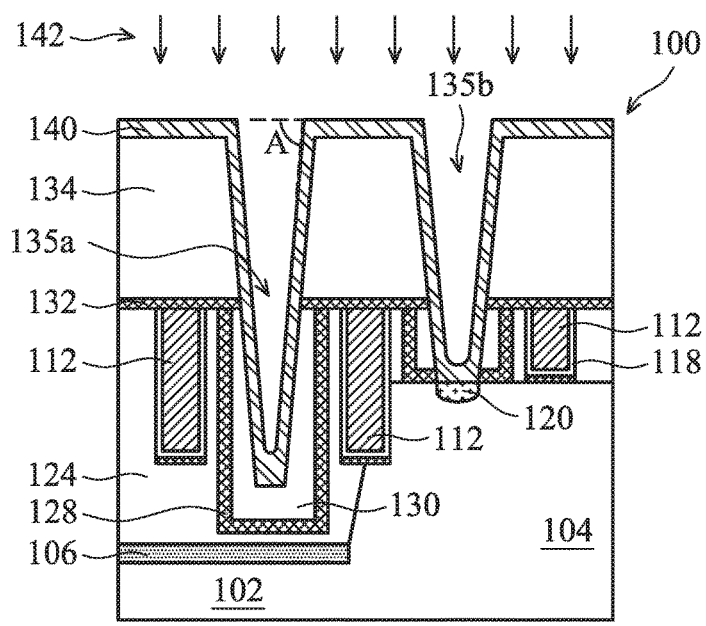

The etch protection layer 140 on the top surface of the ILD layer 134, if present, may be exposed to the highest dosage of the plasma 142. As a result, this portion of the etch protection layer 140 may additionally have different etch selectivity (a higher etch rate in the later etching process). Moreover, the etch protection layer 140 on the sidewalls 137a and 137b may also be exposed to the plasma 142. When the plasma 142 is applied directionally toward the device 100 (e.g., in a direction perpendicular to the top surface, as shown in FIG. 2D), due to their slopes, the sidewalls 137a and 137b are exposed to a much smaller dosage of the plasma 142. As a result, the etch protection layer 140 on the sidewalls 137a and 137b may remain substantially intact in the later etching process. In some embodiments, the slopes of sidewalls 137a and 137b are vertical or near vertical. Specifically, an angle between the sidewall 137a and a top surface of the device 100 (e.g., top of ILD layer 134 or gate structures 112) may be generally 88-90 degrees. An example of this angle is illustrated as angle A in FIG. 2D, where the degree of tapering is somewhat exaggerated for illustration purposes. If the sidewalls 137a and 137b become sufficiently tapered, there is a risk that the etch protection layer 140 deposited thereon may be etched away during the later etching process.

Operation 16 may be performed using any suitable plasma sources such as a radio frequency (RF) plasma source. Any suitable gas or mixture of gases—such as nitrogen ($N_2$), a mixture of helium (He) and ammonia ($NH_3$), or a mixture of argon (Ar) and ammonia ($NH_3$), or other non-nitrogen containing gas(es), or any suitable combinations thereof—may be used for the plasma treatment. A N-containing gas (e.g., containing $N_2$ and/or $NH_3$) in the plasma may elevate plasma ionization capability during plasma treatment, which enhances the following etching and/or cleaning efficiency. In some embodiments, operations 14 and 16 may be repeatedly executed to reach a target thickness of the etch protection layer 140.

At operation 18, the method 10 (FIG. 1) performs a selective etching process by utilizing the plasma-treated etch protection layer 140. For example, in the embodiment shown in FIG. 2E, the selective etching process is performed so as to etch through the etch protection layer 140 on the bottom surface 138b of the contact hole 135b without etching through the etch protection layer 140 on the bottom surface 138a of the contact hole 135a. Note that, depending on the dosage of plasma the bottom surface 138a has been exposed to (in operation 16), operation 18 may still remove a top portion of the etch protection layer 140 on the bottom surface 138a. However, operation 18 is controlled or tailored (e.g., by optimizing its duration or gas bombardment forces) such that operation 18 stops before the protection layer 140 on the bottom surface 138a is penetrated through. Note that a thickness of the etch protection layer 140 on the bottom surface 138a may remain in the final product. Additionally, the etch protection layer 140 on the top surface of the ILD layer 134 has been exposed to a high dosage of the plasma 142, so it is removed in operation 18. In contrast, the etch protection layer 140 on the sidewalls 137a and 137b has been exposed to a low dosage of the plasma 142, so it remains substantially intact in operation 18.

Operation 18's selective etching process is useful because it helps prevent the formation of a potential void at the bottom surface 138a after the contact feature 136a has been filled into the contact hole 135a. Without this process (i.e., had the bottom surface 138a been etched by a dry etching process, exposing the ILD layer 130 thereunder), a portion of the ILD layer 130 near the bottom surface 138a would have been etched away during pre-cleaning, creating a bowing profile under the bottom surface 138a. This bowing profile is difficult to avoid due to the inherent nature of the pre-cleaning process: as the etch protection layer 140 opens at the bottom surface 138a, the pre-cleaning solution attacks the underlying ILD layer 130 and thus leads to the bowing profile. Since the contact hole 135a may be relatively deep and narrow, when the contact feature 136a is filled to the contact hole 135a, the bowing profile may lead to a bottom void (formed by trapped air) since metal cannot completely fill the contact hole 135a. Such a contact bottom void is difficult to detect during the manufacturing stage because the filled metal in the contact hole 135a is not connected to any underlying conductive material, but the void may cause problems (e.g., circuit short or open) in the device 100 during use over time. Accordingly, improvements in contact formation process are desired. Operation 18 helps address this concern of contact void at the bottom of the contact hole 135a.

Figure 2E:
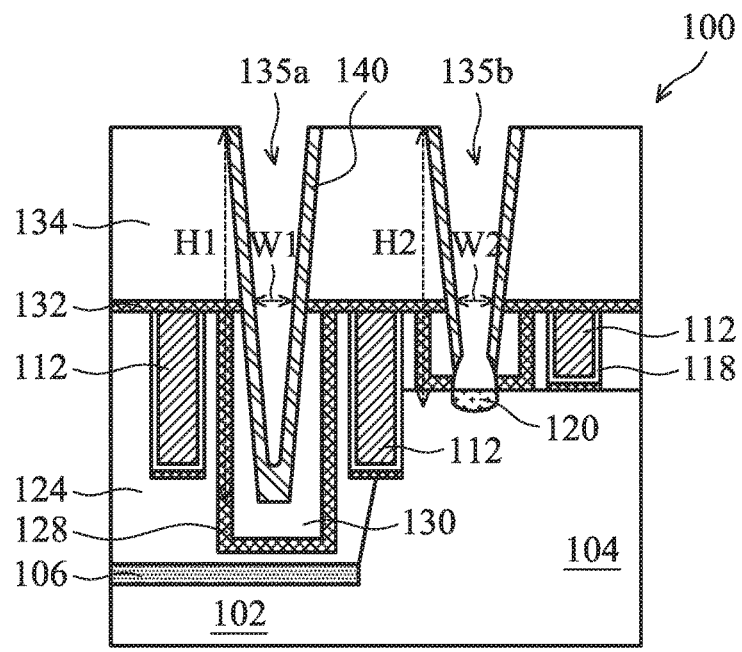

Note that, although FIG. 2E shows a bowing profile formed at the bottom surface 138b of contact hole 135b, this bowing profile is not an issue because the contact hole 135b is relatively shallow and because the degree of bowing is quite small so the contact feature 136b will still completely fill the contact hole 135b without leaving any void therein. The bowing profile has concave side surfaces, which may or may not be symmetric on both sides, and a bottom surface intersecting the side surfaces. Depending on where the bottom surface intersects the side surfaces, the bowing profile may have a bottom width that is greater than, equal to, or less than its top width (e.g., in the bowing profile shown in FIGS. 2G-2I, the bottom is slightly wider than the top). Further, the degree of bowing or concaving is controlled to allow various layers of the contact feature 136b to be properly formed. As further described below, the contact feature 136b may include a barrier layer 139 and a metal fill layer 141, which may be formed by PVD, CVD, ALD, plating, or other suitable methods. Nevertheless, due to the selective etching, in the final device the bottom surface 138b of the contact hole 135b has a bowing profile (filled by the contact feature 136b), but the bottom surface 138a of the contact hole 135a does not contain any bowing profile.

Operation 18's selective etching process may be an isotropic wet etching process that uses a wet etchant such as a diluted HF or KOH solution, a solution containing HF, $HNO_3$, or $CH_3COOH$, or combinations thereof, or other suitable wet etchants. Alternatively, the selective etching process may be an isotropic dry etching process that uses a mixture of ammonia ($NH_3$) and nitrogen trifluoride ($NF_3$) or other suitable gases. The etchant may be designed to remove the plasma-treated portions of the etch protection layer 140 much faster than the untreated (or less-treated) portions of the etch protection layer 140. For example, four minutes of immersion into DHF may realize the selective removal of the etch protection layer 140. The combination of the plasma treating of the etch protection layer 140 and the following isotropic wet etching process disclosed herein is also advantageous over certain conventional approaches, which require anisotropic dry etching, because the wet etching process used herein is relatively easier and simpler (and therefore cheaper) to implement and because it realizes selective removal of the etch protection layer 140.

Since operation 18 uses a wet etching process, it may serve as a pre-cleaning process if the etchant used in operation 18 can remove not only the etch protection layer 140 but also unwanted materials (e.g., oxides) from the surface of the S/D feature 120 before contact feature formation thereon. Therefore, the wet etching process is advantageous over dry etching processes that expose the S/D feature 120 to air or gas, which would have required a separate pre-cleaning process. Of course, if desired or needed (e.g., the etchant does not remove oxides), another pre-cleaning process may be performed after operation 18 to remove any unwanted materials (e.g., oxides) from the surface of the S/D feature 120 before contact feature formation thereon.

In the method 10, operations 14, 16, and 18 may be tailored or optimized in a combined fashion to improve the end result. For example, the composition of the etch protection layer 140 (determined by operation 14) may affect how treatable it is by the plasma 142 (operation 16) as well as how easy it can be etched (operation 18) after plasma treatment. The duration of the plasma treatment in operation 16 and the conditions of the etching process in operation 18 may also impact the result. In an embodiment, at operation 14 the composition of the etch protection layer 140 makes its etching selectivity to the etchant highly sensitive to exposure to the plasma 142, at operation 16 the duration of the plasma treatment maximizes the etch selectivity to the etchant between the bottom surfaces 138a and 138b, and at operation 18 the conditions of the etching process are tailored (e.g., duration, etchant concentration, temperature, etc.) such that the etchant penetrates through the bottom surface 138b but not through the bottom surface 138a. In an embodiment, a duration of operation 18 is dependent on a duration of the plasma treatment of the etch protection layer.

As described above, the selective plasma treatment and etching of the etch protection layer 140 is in large part due to geometric differences of the contact holes 135a and 135b. Specifically, the bottom surface 138a of the contact hole 135a is deeper than the bottom surface 138b of the contact hole 135b and therefore is less or not treated by the plasma 142. As a result, during the etching process, a thickness of the etch protection layer 140 at the bottom surface 138a remains while the etch protection layer 140 at the bottom surface 138b gets removed. In some embodiments, an aspect ratio of contact holes located on fins (e.g., the contact hole 135b) is no greater than 5:1, while an aspect ratio of contact holes located on isolation features (e.g., the contact hole 135a) is no less than 9:1. In this case, the aspect ratio difference between the contact holes 135a and 135b are at least 4:1. As shown in FIG. 2E, the aspect ratio represents a ratio between the height (H) and width (W) of a contact hole (e.g., ratio between H1 and W1 for the contact hole 135a, or a ratio between H2 and W2 for the contact hole 135b). The width may be measured at about the same horizontal level as the CESL 132, since the CD of contact features may be measured at this horizontal level. Note that the widths of the contact holes 135a and 135b (i.e., W1 and W2) may be the same or different. To optimize selective plasma treatment and etching, in some embodiments, an aspect ratio of the contact hole 135b is between 4.7:1 and 7.9:1, while an aspect ratio of the contact hole 135a is between 10.9:1 and 16.3:1. In other words, the aspect ratio difference between the contact holes 135a and 135b are no less than 3:1 but no greater than 11.6:1.

It should be appreciated that, depending on a horizontal dimension (e.g., a CD between 5 nm to 20 nm) of the contact holes, the aspect ratio differences may alternatively be expressed in terms of height differences. For example, when the CD of the contact holes 135a and 135b is about 10 nm, the contact hole 135b may have a height no greater than 50 nm, and the contact hole 135a may have a height no less than 90 nm. When the CD of the contact holes 135a and 135b is about 20 nm, the contact hole 135b may have a height no greater than 100 nm, and the contact hole 135a may have a height no less than 180 nm. In an embodiment, the contact hole 135b has a height of about 85 nm, and the contact hole 135a has a height of about 185 nm. In another embodiment, the contact hole 135b has an aspect ratio of about 4.9:1 (a height of about 73 nm and a width of about 15 nm), and the contact hole 135a has an aspect ratio of about 9.1:1 (a height of about 91 nm and a width of about 10 nm). Since the top surfaces of the contact holes 135a and 135b are at the same level, the bottom surface 138b of the contact hole 135b is situated higher than the bottom surface 138a of the contact hole 135a (e.g., at least 20 nm higher when the CD is about 5 nm, at least 40 nm higher when the CD is about 10 nm, or at least 80 nm higher when the CD is about 20 nm).

Figure 2F:
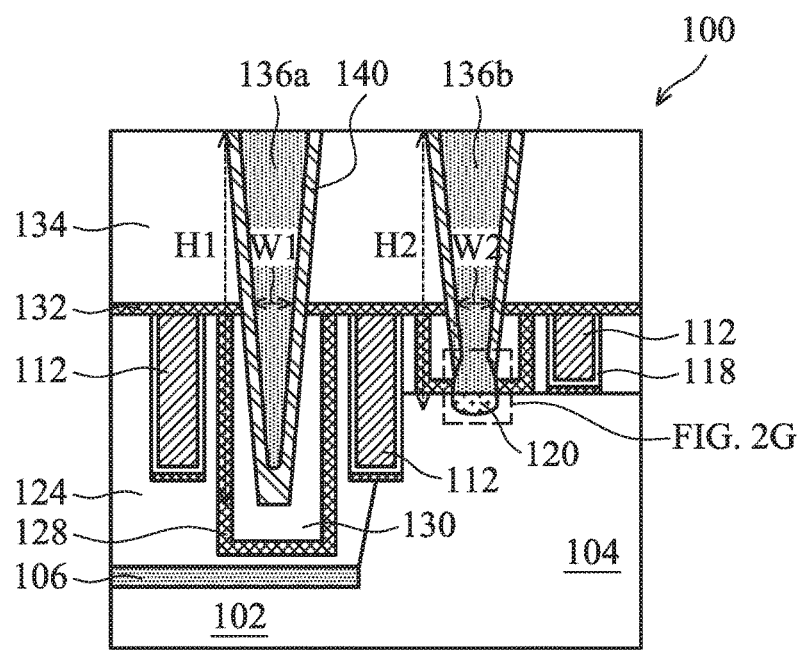
Figure 2G:
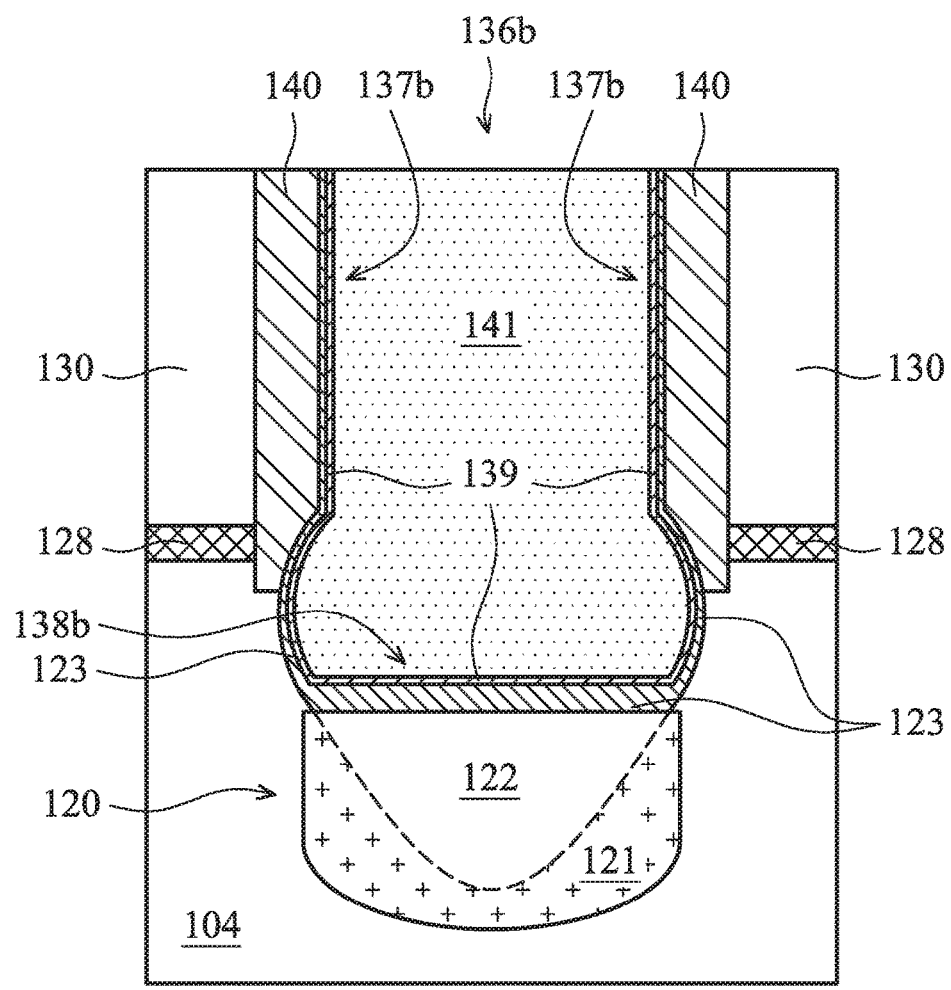
Figure 2H:
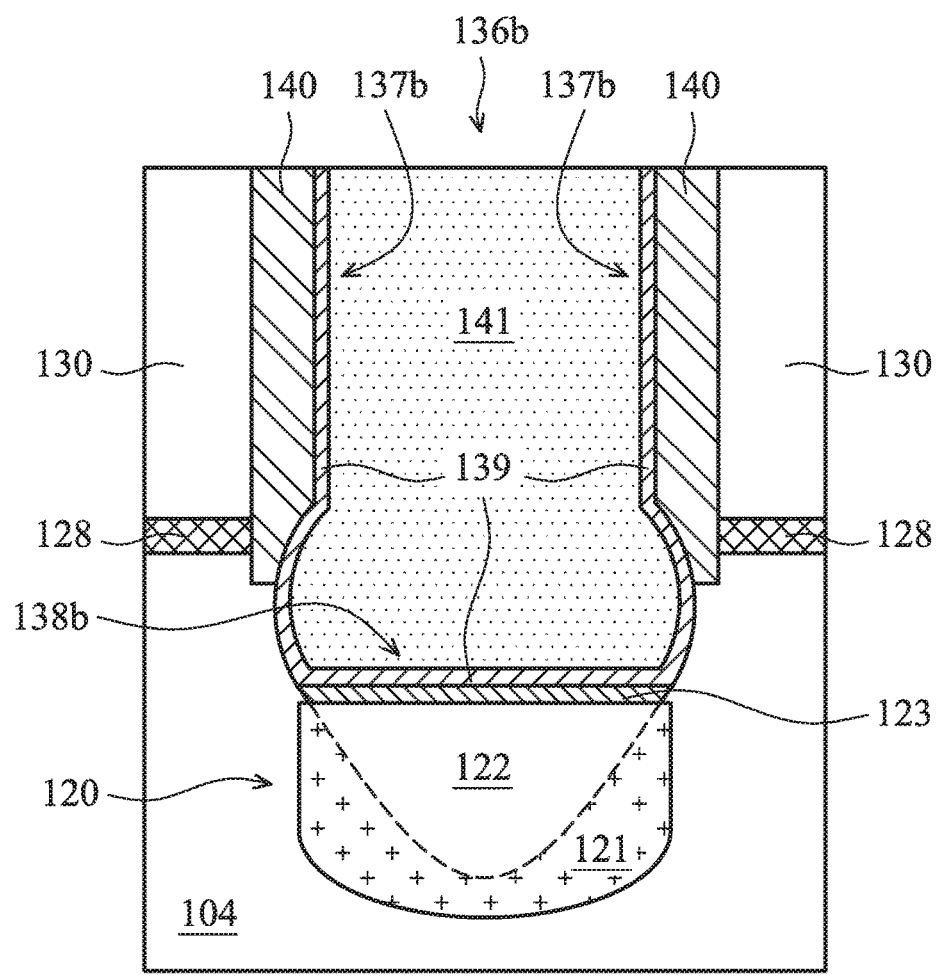
Figure 2I:
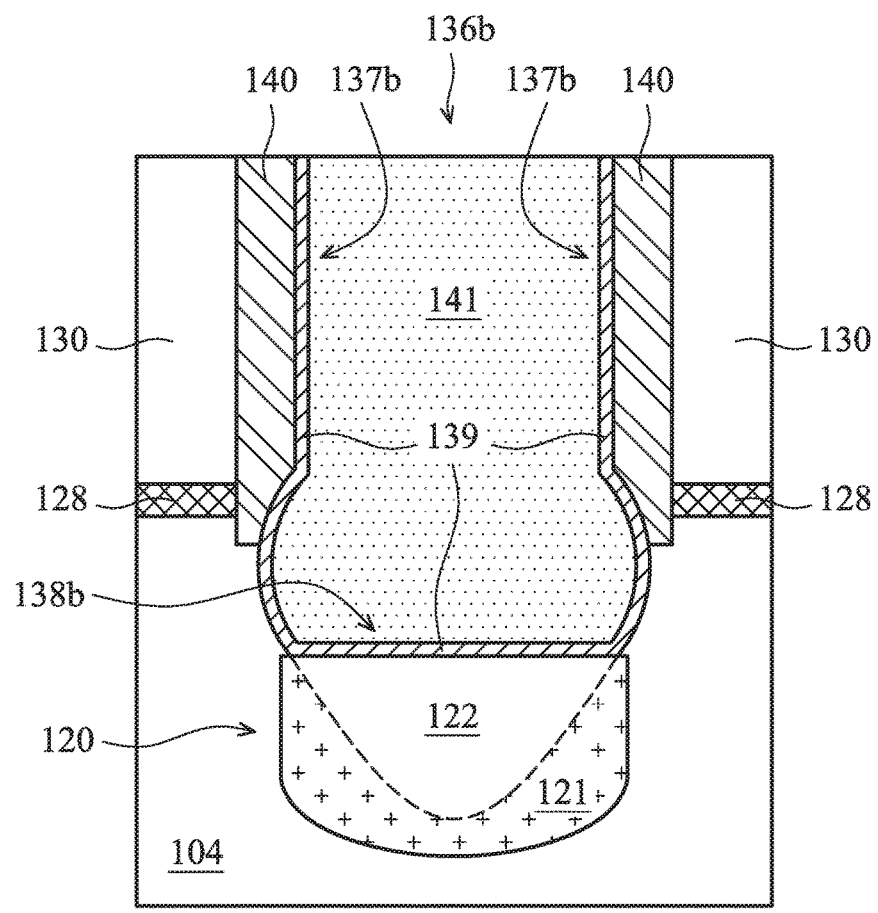

Finally, at operation 20, the method 10 (FIG. 1) deposits one or more conductive materials into the contact holes to form the contact features 136a and 136b (FIG. 2F). Each of the contact features 136a and 136b may include a barrier layer 139 and a metal fill layer 141 over and adjacent the barrier layer 139, as shown in FIGS. 2G-2I which represent alternative close-up views of more detailed features near the bottom surface 138b of the contact hole 135b after the formation of the contact feature 136b. The barrier layer 139 may include a conductive nitride such as TaN or TiN, and the metal fill layer may include aluminum (Al), tungsten (W), copper (Cu), cobalt (Co), titanium (Ti), combinations thereof, or other suitable material. Each of the barrier layer 139 and the metal fill layer 141 may be formed by PVD, CVD, ALD, plating, or other suitable methods. In some embodiments, a silicidation or germano-silicidation may be formed underneath the barrier layer 139 and above (or as part of) the S/D features 120. Advantageously, since the relatively deeper contact hole 135a now has no bowing profile, it becomes relatively easier to be completely filled with the contact feature 136a, preventing or reducing the likelihood of having voids under the contact feature 136a.

As shown in FIG. 2F, the contact features 136a and 136b penetrate the ILD layer 134, the CESL 132, the ILD layer 130, and the CESL 128. Above the fin 104, the contact feature 136b electrically contacts the S/D feature 120. Above the isolation structure 106, the contact feature 136a is separated by the etch protection layer 124 from the underlying ILD layer 130 (or the ILD layer 124 in some embodiments). Note that, although the contact feature 136a is not connected to the S/D feature 120, the contact feature 136a may cross other fins 104 not shown in FIG. 2F. The contact feature 136a may also cross no fin, but can be used for electrical interconnection with other layers of the device 100.

The formation of the contact features 136a and 136b involves various processes. In an embodiment, the method 10 first deposits a metal layer (e.g., Ni, Co, W, Ta, or Ti) in the contact holes 135a and 135b. The method 10 may then perform an annealing process at an elevated temperature, thereby forming a metal silicide layer 122 in the contact hole 135b located on a heavily doped region 121 of the S/D feature 120. Note that the S/D feature 120 may be epitaxially grown on the fin 104 with proper dopant(s), and depending on the amount of epitaxial growth, the S/D feature 120 may rise above, at, or below the top surface of the fin 104 (FIGS. 2G-2I). The metal silicide layer 122 may be considered part of the S/D feature 120, which includes the heavily doped region 121 and the metal silicide layer 122 formed thereon. For example, for a p-type S/D feature 120, the heavily doped region 121 may comprise SiGe, and the metal silicide layer 122 may comprise SiGeNi, SiGeCo, SiGeW, SiGeTa, or SiGeTi. For an n-type S/D feature 120, the heavily doped region 121 may comprise SiP, and the metal silicide layer 122 may comprise SiPNi, SiPCo, SiPW, SiPTa, or SiPTi.

Further, during the silicidation process, a top thickness of the metal layer may be converted to a nitride layer 123 (e.g., by reacting with ambient nitrogen gas during the annealing process). Using the contact hole 135b as an example, as shown in FIG. 2G, the nitride layer 123 may be formed on the bottom surface 138b and the sidewall surface 137b of the contact hole 135b. The nitride layer 123 may comprise various material(s) such as $Ni_3N$, $CO_xN$ (e.g., $Co_2N$, $Co_3N$, and/or $Co_4N$), WN, TaN, or TiN, or combinations thereof. Since sidewall portions of the nitride layer 123 may block lateral space for subsequent processes, in some embodiments the nitride layer 123 is thinned on the sidewall surface 137b in order to open up more space for deposition of the contact feature 136b. FIG. 2G shows very thin sidewall portions of the nitride layer 123 after such a thinning process. In an alternative embodiment, the sidewall portions of the nitride layer 123 are completely removed, as shown in FIG. 2H. In yet another alternative embodiment, the bottom portion as well as the sidewall portions of the nitride layer 123 are completely removed, as shown in FIG. 2I. Note that FIG. 2I also represents embodiments where the nitride layer 123 is not even formed. In addition, after such a thinning or removal process, in some embodiments, a gas mixture ($N_2+H_2$) is used to lightly bombard the surface of the nitride layer 123 (or remaining portions thereof) in order to remove potential oxides that have formed thereon.

Next, the method 10 may form the barrier layer 139 (e.g., TaN or TiN) over the metal silicide layer 122 (and over/adjacent the nitride layer 123 if present) in the contact holes 135a and 135b. In some embodiments, an ALD process is used to uniformly deposit the barrier layer 139 (e.g., TaN or TiN) on the sidewalls 138a and 137b as well as on the bottom surfaces 138a and 138b. The barrier layer 139 (e.g., its sidewall portions) may prevent the to-be-formed metal fill layer 141 from penetrating into surrounding silicon or oxide regions. As illustrated in FIG. 2G, the barrier layer 139 may reside over a bottom portion of the nitride layer 123 and adjacent to sidewall portions of the nitride layer 123. Alternatively, as illustrated in FIG. 2H, the barrier layer 139 may reside over a bottom portion of the nitride layer 123 and directly contact the etch protection layer 140. Note that, if the barrier layer 139 and the nitride layer 123 utilize the same metal (e.g., Ta or Ti), the nitride layer 123 may be considered part of the barrier layer 139. Alternatively, when the nitride layer 123 is not present as illustrated in FIG. 2I, the barrier layer 139 may directly contact the metal silicide layer 122 as well as the etch protection layer 140.

Finally, the method 10 deposits the metal fill layer 141 in the contact holes 135a and 135b. In some embodiments, a combination of PVD and CVD processes may be used when depositing the metal fill layer 141. For example, a PVD process may be used first to deposit a thin cobalt layer as seed layer (at slower deposition rate but with higher quality), and then a CVD process may be used to deposit a thick cobalt layer as bulk layer (at faster deposition rate but perhaps not with same quality as cobalt seed layer). When depositing the seed layer, its thickness is controlled so that it does not block the deposition of the bulk layer in the bowing profile region. As shown in FIGS. 2G-2I, in the final device structure, the bowing profile (filled by the contact feature 136b) remains in the bottom surface 138b of the contact hole 135b.

The method 10 may proceed to further operations to complete the fabrication of the device 100. For example, the method 10 may form one or more dielectric layers atop the ILD layer 134, form gate contact plugs (vias) over the gate structures 112, and form metal interconnects to connect terminals of various transistors to form an IC.

Although not intended to be limiting, one or more embodiments of the present disclosure provide many benefits to a semiconductor device and a formation process thereof. For example, embodiments of the present disclosure form contact features without any bottom void even though certain contact features between fins are relatively deeper and have higher aspect ratios. As a result, these contact features are more reliable during use. Further, the fabrication process is simplified, e.g., by the use of a wet etching process. Still further, embodiments of the present disclosure can be readily integrated into existing semiconductor fabrication processes.

In one exemplary aspect, the present disclosure is directed to a method for semiconductor fabrication, comprising: providing a device structure having an isolation structure, a fin adjacent the isolation structure, gate structures over the fin and the isolation structure, one or more dielectric layers over the isolation structure and the fin and between the gate structures, a first contact hole over the fin, and a second contact hole over the isolation structure; depositing a protection layer that covers at least bottom surfaces and sidewall surfaces of the first and second contact holes; treating the protection layer with a plasma so that the protection layer on the bottom surface of the first contact hole and the protection layer on the bottom surface of the second contact hole have different etch selectivity in an etching process; and performing the etching process to the protection layer so as to etch through the protection layer on the bottom surface of the first contact hole without etching through the protection layer on the bottom surface of the second contact hole. In an embodiment, the method further comprises, after the performing of the etching process, forming first and second contact features in the first and second contact holes, respectively. The first contact feature in the first contact hole is electrically connected to a S/D feature situated on the fin. In an embodiment, forming the first contact feature in the first contact hole comprises: depositing a metal layer in the first contact hole; forming a metal silicide layer in the first contact hole by annealing the device structure including the metal layer at an elevated temperature; and filling a metal fill layer in the first contact hole over the metal silicide layer. In an embodiment, treating the protection layer with plasma comprises treating the protection layer on the bottom surface of the first contact hole with a higher dosage of the plasma than the protection layer on the bottom surface of the second contact hole. The etching process removes the protection layer on the bottom surface of the first contact hole at a faster etch rate than the protection layer on the bottom surface of the second contact hole. In an embodiment, the plasma is selected from the group consisting of: nitrogen ($N_2$), a mixture of helium (He) and ammonia ($NH_3$), a mixture of argon (Ar) and ammonia ($NH_3$). The plasma is directionally applied to treat the protection layer in the first and second contact holes. In an embodiment, the protection layer comprises silicon nitride. The protection layer is deposited to conformally cover at least the bottom surfaces and the sidewall surfaces of the first and second contact holes. In an embodiment, the etching process is an isotropic etching process. In an embodiment, the isotropic etching process uses a wet etchant comprising hydrofluoric acid (HF) to selectively etch portions of the protection layer. In an embodiment, an aspect ratio of the first contact hole is no greater than 5:1 and an aspect ratio of the second contact hole is no less than 9:1. In an embodiment, an angle between a top surface of the device structure and the sidewall surfaces of the first and second contact holes is between 88 and 90 degrees.

In another exemplary aspect, the present disclosure is directed to a method for semiconductor fabrication comprising providing a device structure. The device structure has a substrate; a fin extending from the substrate; an inter-layer dielectric (ILD) layer over the substrate and adjacent the fin; gate structures over the fin and adjacent the ILD layer, where the fin, the ILD layer, and the gate structures define a first contact hole over the fin and a second contact hole over the ILD layer and offset from the fin, and where a bottom surface of the first contact hole is situated higher than a bottom surface of the second contact hole; and an etch protection layer covering at least sidewall surfaces and the bottom surface of the first contact hole as well as sidewall surfaces and the bottom surface of the second contact hole. The method further comprises applying a plasma to treat the etch protection layer in the first and second contact holes; after the applying of the plasma, removing the etch protection layer from the bottom surface of the first contact hole while keeping a thickness of the etch protection layer on the bottom surface of the second contact hole; and forming first and second contact features in the first and second contact holes, respectively. In an embodiment, the plasma is applied to selectively treat the etch protection layer such that the etch protection layer on the bottom surface of the first contact hole is exposed to a higher dosage of the plasma than the etch protection layer on the bottom surface of the second contact hole. In an embodiment, the plasma is selected from the group consisting of: nitrogen ($N_2$), a mixture of helium (He) and ammonia ($NH_3$), a mixture of argon (Ar) and ammonia ($NH_3$), and wherein the plasma is applied to treat the etch protection layer in a direction that is perpendicular to a top surface of the device structure. In an embodiment, the etch protection layer has a uniform thickness across the sidewall surfaces and the bottom surfaces of the first and second contact holes. In an embodiment, the removing of the etch protection layer comprises using an isotropic wet etching process, wherein a duration of the isotropic wet etching process is dependent on a duration of the plasma treatment of the etch protection layer. In an embodiment, the first and second contact holes have substantially identical horizontal widths when measured at a top surface of the gate structures, and wherein the bottom surface of the first contact hole is situated at least 40 nm higher than the bottom surface of the second contact hole. In an embodiment, the first contact feature in the first contact hole is electrically connected to a S/D feature of the fin, and the second contact feature in the second contact hole is separated from the ILD layer under the bottom surface of the second contact hole by the etch protection layer.

In yet another exemplary aspect, the present disclosure is directed to a semiconductor device comprising: a substrate; a fin extending from the substrate; one or more dielectric layers over the substrate and adjacent the fin; gate structures over the fin and adjacent the one or more dielectric layers. The fin, the one or more dielectric layers, and the gate structures define a first contact hole over the fin and a second contact hole over the substrate and offset from the fin. A bottom surface of the first contact hole is situated higher than a bottom surface of the second contact hole. The bottom surface of the first contact hole includes a bowing profile but the bottom surface of the second contact hole does not contain any bowing profile. The device further comprises a silicon nitride layer in the first and second contact holes, and first and second contact features situated in the first and second contact holes, respectively. The silicon nitride layer covers sidewall surfaces of the first contact hole but not the bottom surface of the first contact hole. The silicon nitride layer covers sidewall surfaces and the bottom surface of the second contact hole. The first contact feature is electrically connected to the fin, and the second contact feature is separated from the one or more dielectric layers below the bottom surface of the second contact hole by the silicon nitride layer. In an embodiment, a difference between an aspect ratio of the first contact hole and an aspect ratio of the second contact hole is no less than 4:1. In an embodiment, an angle between a top surface of the semiconductor device and the sidewall surfaces of the first and second contact holes is between 88 and 90 degrees.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor fabrication, comprising:
providing a device structure having an isolation structure, a fin adjacent the isolation structure, gate structures over the fin and the isolation structure, one or more dielectric layers over the isolation structure and the fin and between the gate structures, a first contact hole over the fin, and a second contact hole over the isolation structure;
depositing a protection layer that covers at least bottom surfaces and sidewall surfaces of the first and second contact holes;
treating the protection layer with a plasma so that the protection layer on the bottom surface of the first contact hole and the protection layer on the bottom surface of the second contact hole have different etch selectivity in an etching process; and
performing the etching process to the protection layer so as to etch through the protection layer on the bottom surface of the first contact hole without etching through the protection layer on the bottom surface of the second contact hole.

2. The method of claim 1, further comprising, after the performing of the etching process, forming first and second contact features in the first and second contact holes, respectively, wherein the first contact feature in the first contact hole is electrically connected to a source/drain (S/D) feature situated on the fin.

3. The method of claim 2, wherein forming the first contact feature in the first contact hole comprises:
depositing a metal layer in the first contact hole;
forming a metal silicide layer in the first contact hole by annealing the device structure including the metal layer at an elevated temperature; and
filling a metal fill layer in the first contact hole over the metal silicide layer.

4. The method of claim 1, wherein treating the protection layer with plasma comprises treating the protection layer on the bottom surface of the first contact hole with a higher dosage of the plasma than the protection layer on the bottom surface of the second contact hole, and wherein the etching process removes the protection layer on the bottom surface of the first contact hole at a faster etch rate than the protection layer on the bottom surface of the second contact hole.

5. The method of claim 4, wherein the plasma is selected from the group consisting of: nitrogen ($N_2$), a mixture of helium (He) and ammonia ($NH_3$), a mixture of argon (Ar) and ammonia ($NH_3$), and wherein the plasma is directionally applied to treat the protection layer in the first and second contact holes.

6. The method of claim 5, wherein the protection layer comprises silicon nitride, and wherein the protection layer is deposited to conformably cover at least the bottom surfaces and the sidewall surfaces of the first and second contact holes.

7. The method of claim 1, wherein the etching process is an isotropic etching process.

8. The method of claim 7, wherein the isotropic etching process uses a wet etchant comprising hydrofluoric acid (HF) to selectively etch portions of the protection layer.

9. The method of claim 1, wherein an aspect ratio of the first contact hole is no greater than 5:1 and an aspect ratio of the second contact hole is no less than 9:1.

10. The method of claim 1, wherein an angle between a top surface of the device structure and the sidewall surfaces of the first and second contact holes is between 88 and 90 degrees.

11. A method for semiconductor fabrication, comprising:
providing a device structure having:
a substrate;
a fin extending from the substrate;
an inter-layer dielectric (ILD) layer over the substrate and adjacent the fin;
gate structures over the fin and adjacent the ILD layer, wherein the fin, the ILD layer, and the gate structures define a first contact hole over the fin and a second contact hole over the ILD layer and offset from the fin, wherein a bottom surface of the first contact hole is situated higher than a bottom surface of the second contact hole; and
an etch protection layer covering at least sidewall surfaces and the bottom surface of the first contact hole as well as sidewall surfaces and the bottom surface of the second contact hole;
applying a plasma to treat the etch protection layer in the first and second contact holes;
after the applying of the plasma, removing the etch protection layer from the bottom surface of the first contact hole while keeping a thickness of the etch protection layer on the bottom surface of the second contact hole; and
forming first and second contact features in the first and second contact holes, respectively.

12. The method of claim 11, wherein the plasma is applied to selectively treat the etch protection layer such that the etch protection layer on the bottom surface of the first contact hole is exposed to a higher dosage of the plasma than the etch protection layer on the bottom surface of the second contact hole.

13. The method of claim 12, wherein the plasma is selected from the group consisting of: nitrogen ($N_2$), a mixture of helium (He) and ammonia ($NH_3$), a mixture of argon (Ar) and ammonia ($NH_3$), and wherein the plasma is applied to treat the etch protection layer in a direction that is perpendicular to a top surface of the device structure.

14. The method of claim 11, wherein the etch protection layer has a uniform thickness across the sidewall surfaces and the bottom surfaces of the first and second contact holes.

15. The method of claim 11, wherein the removing of the etch protection layer comprises using an isotropic wet etching process, wherein a duration of the isotropic wet etching process is dependent on a duration of the plasma treatment of the etch protection layer.

16. The method of claim 11, wherein the first and second contact holes have substantially identical horizontal widths when measured at a top surface of the gate structures, and wherein the bottom surface of the first contact hole is situated at least 40 nm higher than the bottom surface of the second contact hole.

17. The method of claim 11, wherein the first contact feature in the first contact hole is electrically connected to a source/drain (S/D) feature of the fin, and wherein the second contact feature in the second contact hole is separated from the ILD layer under the bottom surface of the second contact hole by the etch protection layer.

18. A semiconductor device comprising:
   a substrate;
   a fin extending from the substrate;
   one or more dielectric layers over the substrate and adjacent the fin;
   gate structures over the fin and adjacent the one or more dielectric layers, wherein the fin, the one or more dielectric layers, and the gate structures define a first contact hole over the fin and a second contact hole over the substrate and offset from the fin, wherein a bottom surface of the first contact hole is situated higher than a bottom surface of the second contact hole, and wherein the bottom surface of the first contact hole comprises a bowing profile but the bottom surface of the second contact hole does not contain any bowing profile;
   a silicon nitride layer in the first and second contact holes, wherein the silicon nitride layer covers sidewall surfaces of the first contact hole but not the bottom surface of the first contact hole, wherein the silicon nitride layer covers sidewall surfaces and the bottom surface of the second contact hole; and
   first and second contact features situated in the first and second contact holes, respectively, wherein the first contact feature is electrically connected to the fin, and wherein the second contact feature is separated from the one or more dielectric layers below the bottom surface of the second contact hole by the silicon nitride layer.

19. The semiconductor device of claim 18, wherein a difference between an aspect ratio of the first contact hole and an aspect ratio of the second contact hole is no less than 4:1.

20. The semiconductor device of claim 18, wherein an angle between a top surface of the semiconductor device and the sidewall surfaces of the first and second contact holes is between 88 and 90 degrees.

* * * * *